US009779914B2

(12) United States Patent
Fischione et al.

(10) Patent No.: US 9,779,914 B2
(45) Date of Patent: Oct. 3, 2017

(54) APPARATUS FOR PREPARING A SAMPLE FOR MICROSCOPY

(71) Applicant: E.A. Fischione Instruments, Inc., Export, PA (US)

(72) Inventors: Paul E. Fischione, Export, PA (US); Michael F. Boccabella, North Huntington, PA (US)

(73) Assignee: E.A. Fischione Instruments, Inc., Export, PA (US)

( * ) Notice: Subject to any disclaimer, the term of this patent is extended or adjusted under 35 U.S.C. 154(b) by 348 days.

(21) Appl. No.: 14/341,284

(22) Filed: Jul. 25, 2014

(65) Prior Publication Data

US 2016/0027612 A1    Jan. 28, 2016

(51) Int. Cl.
| | | |
|---|---|---|
| *H01J 37/305* | (2006.01) | |
| *H01J 37/20* | (2006.01) | |
| *H01J 37/28* | (2006.01) | |
| *H01J 37/29* | (2006.01) | |
| *H01J 37/304* | (2006.01) | |

(52) U.S. Cl.
CPC .......... *H01J 37/3056* (2013.01); *H01J 37/20* (2013.01); *H01J 37/28* (2013.01); *H01J 37/292* (2013.01); *H01J 37/304* (2013.01); *H01J 2237/30466* (2013.01); *H01J 2237/31745* (2013.01); *H01J 2237/31749* (2013.01)

(58) Field of Classification Search
USPC ............ 250/306, 307, 309, 310, 311, 492.21
See application file for complete search history.

(56) References Cited

U.S. PATENT DOCUMENTS

| | | | |
|---|---|---|---|
| 5,952,658 A | 9/1999 | Shimase | |
| 5,986,264 A * | 11/1999 | Grunewald | ............ G01N 1/32 |
| | | | 250/310 |
| 7,276,691 B2 | 10/2007 | Kodama | |
| 8,170,832 B2 | 5/2012 | Young | |
| 2006/0097166 A1* | 5/2006 | Ishitani | ............ H01J 37/26 |
| | | | 250/310 |
| 2008/0308727 A1 | 12/2008 | Boguslavsky | |
| 2012/0080406 A1 | 4/2012 | Boguslavsky | |
| 2012/0103938 A1 | 5/2012 | Boguslavsky | |
| 2012/0187285 A1 | 7/2012 | Young | |
| 2013/0168549 A1 | 7/2013 | Yamazaki | |
| 2013/0180843 A1 | 7/2013 | Boguslavsky | |
| 2014/0284307 A1* | 9/2014 | Asahata | ............ H01J 37/3056 |
| | | | 216/60 |

OTHER PUBLICATIONS

International Searching Authority; International Search Report and Written Opinion of the International Searching Authority; International Application No. PCT/US15/40728; Patent Cooperation Treaty; pp. 1-10; publisher United States International Searching Authority; Published Alexandria, Virginia, US; copyright and dated Oct. 16, 2015; copy enclosed (10 pages).

* cited by examiner

*Primary Examiner* — Kiet T Nguyen
(74) *Attorney, Agent, or Firm* — Metz Lewis Brodman Must O'Keefe LLC

(57) ABSTRACT

An apparatus for preparing a sample for microscopy is provided that has a milling device that removes material from a sample in order to thin the sample. An electron beam that is directed onto the sample is present along with a detector that detects when the electron beam has reached a preselected threshold transmitted through or immediately adjacent the sample. Once the detector detects the electron beam has reached this threshold, the milling device terminates the milling process.

35 Claims, 11 Drawing Sheets

APPARATUS FOR PREPARING A SAMPLE FOR MICROSCOPY

FIELD OF THE INVENTION

The present invention relates generally to an apparatus that is used to prepare a sample for subsequent imaging and analysis by way of a microscopy device such as a scanning electron microscope or a transmission electron microscope. More particularly, the present application relates to an apparatus for preparing a sample for microscopy that features a milling device such as an ion source and an electron column and detector(s) for imaging the sample and simultaneously detecting the nature and extent of milling activity.

BACKGROUND

The use of microscopy to investigate samples requires high sample quality to ensure adequate sample imaging and analytical data, including structural information and chemical compositions, are obtained. In particular, thin samples are needed in order to obtain accurate results. In order to obtain a thin enough sample, a milling device is directed onto the sample and material is removed from the sample for thinning. A known apparatus of this type includes an ion source and equipment for imaging the sample. The sample may be mounted onto a grid that is in turn mounted on a sample holder. The sample holder is adapted for insertion into a goniometer that is capable of reorienting the sample with respect to the ion source. The sample may be milled on both the top and bottom surfaces for thinning purposes, and this milling is typically a momentum transfer process in which a primary ion beam strikes the sample surface and sputters an amount of material. Alternatively, a section may be removed from the sample by way of directing the ions onto the sample at a particular angle and a given position. The goniometer and holder permit the position of the sample to be adjusted with respect to the ion beam emanating from the ion source to cause adjustment of the degree and angle of the milling of the sample. The ion beam may also be displaced with respect to the sample, including scanning or rastering across the surface of the sample. The combination of the sample holder and goniometer also serves as a vacuum seal between the processing chamber and the ambient environment.

A focused ion beam (FIB) may initially be used to mill the sample from bulk material, and the sample can be configured as a lamella. The FIB may utilize a liquid-metal ion source such as one based upon gallium or other elements. The FIB, however, utilizes a beam which is appropriate for gross sizing of the sample, but poorly adapted for fine modification of the sample which will result in electron transparency for certain imaging. The use of the FIB may therefore create detrimental aspects of the sample, such as changing crystalline material to an amorphous structure and implanting metal ions into the sample.

When a transmission electron microscope (TEM) is to be utilized to observe or analyze the sample, it is typically required that the sample be reduced to a thickness permitting electron transparency. In certain instances, a scanning electron microscope (SEM) may also require fine dimensional control of the dimensions of the sample. Unfortunately, if the sample was not milled to the required dimensions, the results obtained in the microscopic analysis will not be complete. The operator must then remove the sample from the microscopy device and place it back into the milling apparatus and remove additional material from the sample. This process may be time consuming and require guess work by the operator. However, once an operator obtains a sufficient amount of experience he or she may become proficient at determining exactly how much milling needs to be done on a particular material. Although with enough experience the operator may be capable of adequately preparing a sample for microscopic analysis, the possibility of making an error by incorrectly estimating material removal remains. Further, for novice operators, thinning samples for sensitive microscopic analysis presents certain challenges. Finally, it may be necessary to thin a number of samples in a repetitious manner with highly consistent results. It may be desired to improve accuracy, speed and consistent repeatability with which samples can be prepared for imaging and analysis. As such, there remains room for variation and improvement within the art.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figs, in which.

Figure 1:
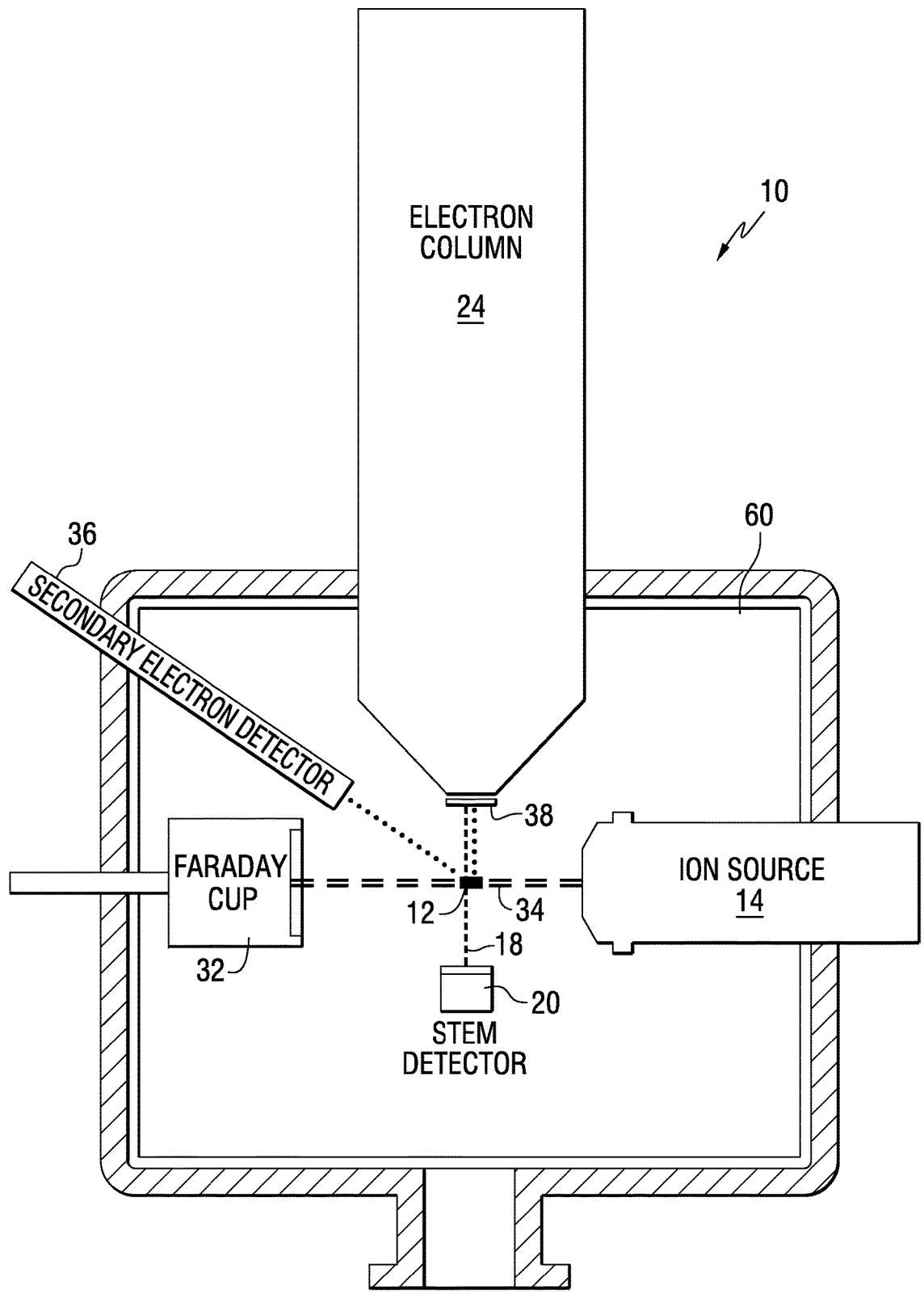
FIG. 1 is a front diagrammatic view of an apparatus for preparing a sample for microscopy in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162, Further, all limits mentioned herein include all other limits included in the mentioned limits. For instance, a limit of up to 7 also includes a limit of up to 5, up to 3, and up to 4.5.

Figure 2:
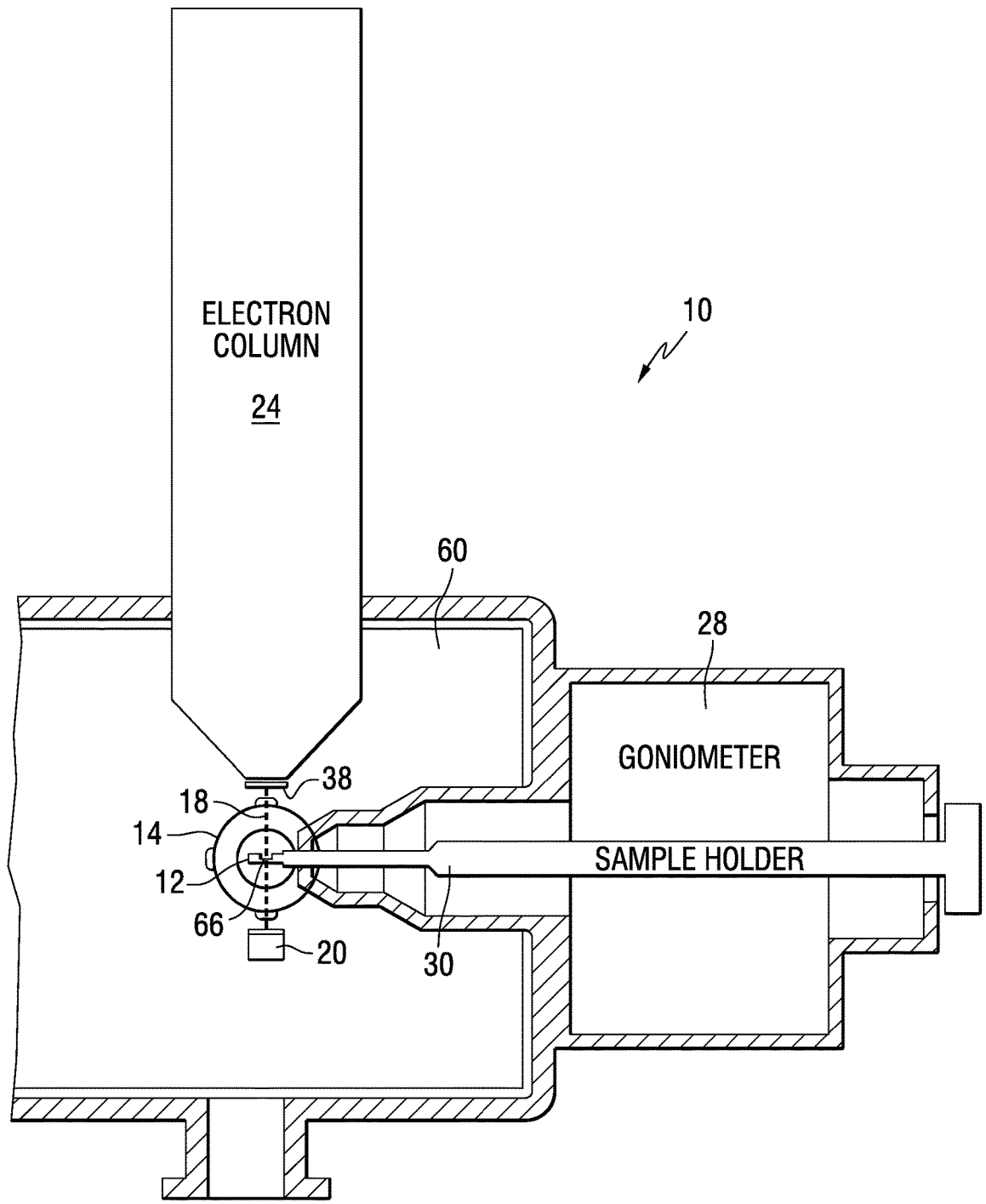
FIG. 2 is a front diagrammatic view of the apparatus of FIG. 1 rotated 90 degrees and spaced from the view in FIG. 1 in which additional portions of the apparatus are shown.

Referring now to FIGS. 1 and 2, the present invention provides for an apparatus 10 for use in preparing a sample 12 for microscopic imaging and analysis, such as by scanning electron microscopy (SEM), transmission electron microscopy (TEM), scanning transmission electron microscopy (STEM), high-angle annular dark-field (HAADF) microscopy, high resolution transmission electron microscopy (HREM), electron energy loss spectroscopy (EELS), energy-filtered transmission electron microscopy (EFTEM), energy-dispersive X-ray spectroscopy (EDS). The primary function of the device is the milling of the sample. However, a critical limitation of prior milling devices is the ability to observe the sample in situ while the milling operation is in process with a resolution great enough to detect very minor features and modifications of the sample. In general, the apparatus includes a milling component that may include an ion source 14 that thins the sample 12. For the purpose of imaging or observing the sample 12 during the milling operation, an electron column 24 may impinge the sample 12 with an electron beam 18, and a detector 20 may detect the degree to which the electron beam 18 is being blocked by the sample 12. The electron beam 18 is scanned across at least one of the top and bottom surfaces of sample 12 while the sample 12 is being milled. At the point when the detector 20 receives a preselected threshold of electrons from electron beam 18, passing either through or adjacent sample 12, the thinning of the sample 12 may be terminated and the sample 12 will be ready for the microscopic imaging and analysis. The detector 20 may be associated with a logic circuit which terminates the milling operation by comparing detector 20 output to a preselected threshold value stored in memory or the sample 12 can be thinned on a manual basis by human operation. Additionally the sample 12 may be milled to a preselected thickness with an automatic cessation of milling.

FIG. 1 shows an apparatus 10 for preparing a sample 12 for microscopy in accordance with one exemplary embodiment. The sample 12 may be located within a chamber 60 that can be closed or sealed as desired. The chamber 60 may be a vacuum chamber in certain arrangements. The sample 12 that is to be prepared for microscopy can be placed within the chamber 60, and the sample 12 can be made of any type of material or combination of materials 16. The apparatus may include an ion source 14 that can function to remove material 16 from the sample 12. The ion source 14 is typically a device in which a plasma is generated from ionized gasses. The gas is typically selected from the inert gas category and may be one of xenon, argon or neon. In some arrangements, the ion source 14 may be an ion source that directs ions 34, or alternatively and equivalently, ion beam 34 onto the sample 12 in order to remove material 16 from the sample 12. The ion source 14 can be any type of ion source.

The apparatus 10 may also include a Faraday cup 32 that is positioned opposite the ion source 14 so that the sample 12 is between the Faraday cup 32 and the ion source 14. The Faraday cup 32 receives the ion beam 34 emitted from the ion source 14 and is used to measure the current of the ions from the emitted ion beam 34. This measurement by the Faraday cup 32 will aid the apparatus 10 in conducting the milling process of the sample 12.

The apparatus 10 also includes an imaging component which may include an electron beam 18 that is directed onto the sample 12. The electron beam 18 may be generated from any source. In the exemplary embodiments shown, the electron beam 18 is generated by an electron source and focused by an electron column 24. The electron column 24 may be a component that is found in a standard SEM or may be any other component capable of controlling an electron beam 18. The electron beam 18 may be detected by a detector 20 that can also be part of the apparatus 10. The detector 20 can be any device capable of detecting the electron beam 18. In some arrangements, the detector 20 is a scanning/transmission electron microscope (S/TEM) detector. The detector 20 may detect one or more electrons of the electron beam 18 passing through or adjacent to the sample 12. The detector 20 may have various portions or sensors that detect a pattern of the electrons emerging from the sample 12. For instance, the detector 20 can have a bright field portion that detects the electrons located in the bright field of the scattering created by the impingement of electrons on the sample material. The detector 20 may also have an annular dark field portion and a high angle dark field portion for detecting one or more electrons from the electron beam 18 that are located in these areas of the electron scattering after exiting the sample 12. However, in its broadest sense the detector 20 is a device that detects one or more electrons from the electron beam 18 after they have traveled either through or adjacent the sample 12.

The apparatus 10 may also include imaging equipment that can be used to image the sample 12 to aid in both the milling process and in electron detection. A backscatter electron detector 38 can be present and may be located on a side of the sample 12 opposite from the detector 20 so that the sample 12 is between the backscatter electron detector 38 and the detector 20. The backscatter electron detector 38 may be capable of detecting primary electrons that have been redirected back from the near side of the sample 12 facing the electron beam 18. The backscatter electron detector 38 provides information regarding the detected electrons and this data is used to image the near side surface of sample 12 that is in the apparatus 10. Further, a secondary electron detector 36 may be located in the apparatus 10 and can also be used for imaging of the sample 12. The secondary electron detector 36 can detect electrons that were generated from the electron column 24 and may also detect secondary electrons that are induced by the ions 34. The detected electrons may be those that have been redirected from the sample 12 and then subsequently to the secondary electron detector 36. Data collected by the secondary electron detector 36 may be used by the apparatus 10 to create an image of the sample 12 to aid in the milling and electron beam 18 detection processes. For example, the imaging of the sample 12 can help accurately direct the ions 34 onto the appropriate section of the sample 12. Further, proper impingement placement of the electron beam 18 onto the thinned location of the sample 12 will help provide an accurate measurement of when the electron beam 18 has transmitted through or traversed past the sample 12 for detection.

The apparatus 10 may include additional components as shown for example in FIG. 2. Additional components shown in FIG. 2 may have been placed in FIG. 1, but in the interest of clarity are shown in an additional figure. For reference purposes, the electron column 24, backscatter electron detector 38, ion source 14 and detector 20 are arranged in the same manner as FIG. 1. The apparatus 10 may further include a goniometer 28 that receives a sample holder 30.

Figure 2A:
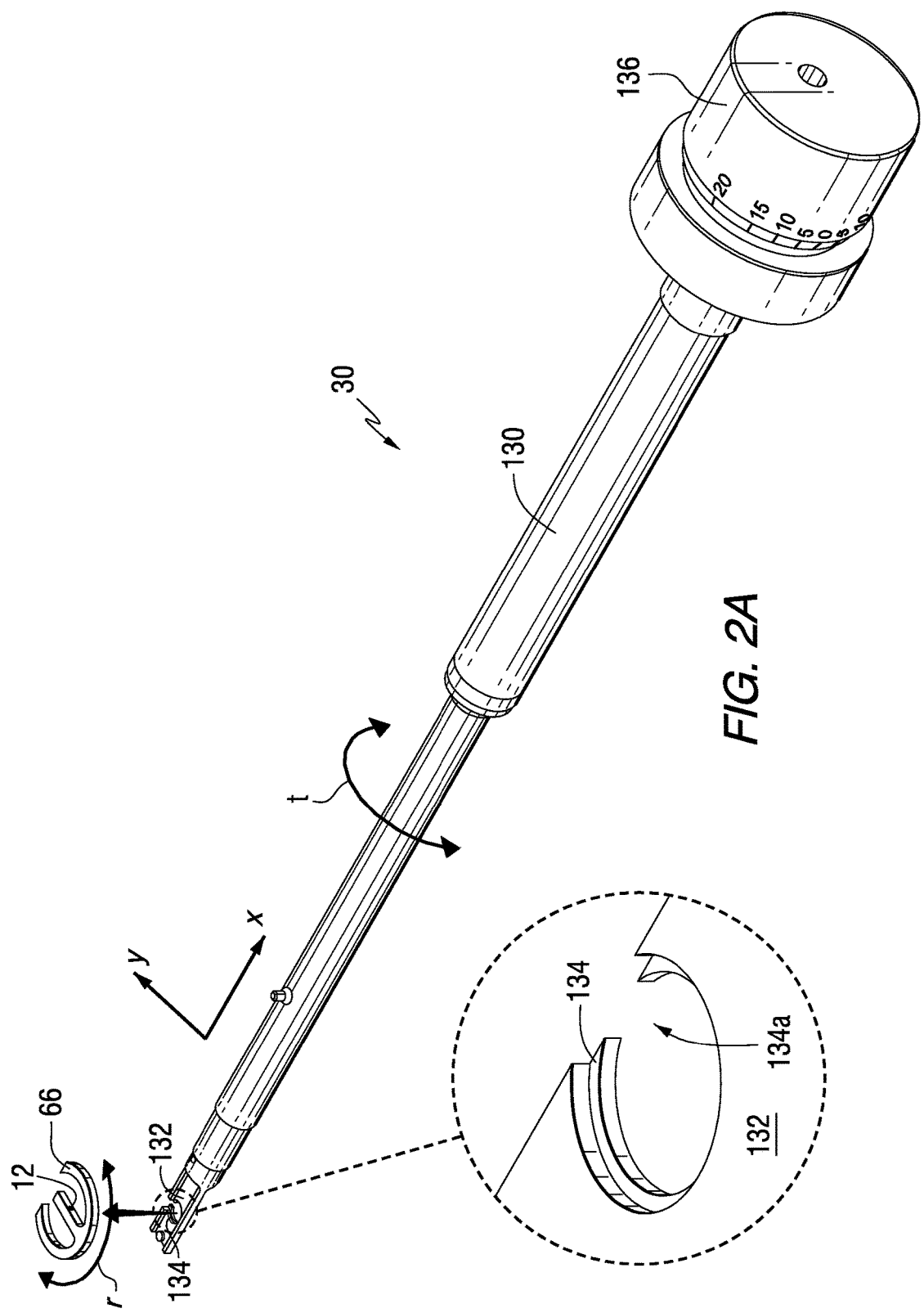
FIG. 2A is an isometric view of a specimen holder for insertion into the apparatus of FIG. 1 and FIG. 2.

Referring now to FIG. 2A, the holder 30 is illustrated in more detail. A holder body 130 is an elongated, tubular shaft which supports an endpiece 132 which includes an integral mounting surface 134, which may be more clearly identified in the inset section of FIG. 2A. Mounting surface 134 is further provided with milling gap 134A and is rotatable along curved arrow r with respect to endpiece 132 and is controlled by rotation adjustment knob 136. Milling gap 134A permits the ingress of ion beam 34 within the endpiece 132 and access to sample 12. Grid 66 or any other sample material, such as a 3 mm diameter disk which will be centrally thinned, is mounted on mounting surface 134. The mechanism of rotation may be by any known method as would be apparent to one skilled in the art and housed within holder body 130. Rotation is typically up to and including ±35 degrees with respect to the incident ion beam 34. Exploded from mounting surface 134, and magnified for the purpose of clarity, grid 66 is shown in its relative mounting position with respect to mounting surface 134. Sample 12 is shown mounted on grid 66, as will be more fully discussed, below. The manipulation of rotation adjustment knob 136 permits fine and accurate rotational alignment of the grid 66 and sample 12 with the path of at least one of ion beam 34 and electron beam 18. The primary function of the rotation of the sample 12 is to align the leading edge of sample 12 normal to the incident ion beam 34. Ion beam 34 may be scanned or rastered along the leading edge of sample 12 or may be held at a single location. Additionally, the sample 12 may be rotated during milling operations to provide consistent milling rates of heterogeneous materials by altering the distance from the leading edge of sample 12 to ion source 14. Milling distances are typically in the range of 10±1 mm. Adjustment of this milling distance is useful in modulating the milling rate of ion source 14 and its effect on the sample 12.

Sample holders are typically manufactured to exacting specifications for insertion and interaction with TEMs made by different manufacturers and are typically not interchangeable. Sample holder 30 may be a holder specifically constructed for use in a TEM or may be specifically designed for use in apparatus 10. As illustrated in the Figures, sample holder 30 is specific to apparatus 10.

Figure 2B:
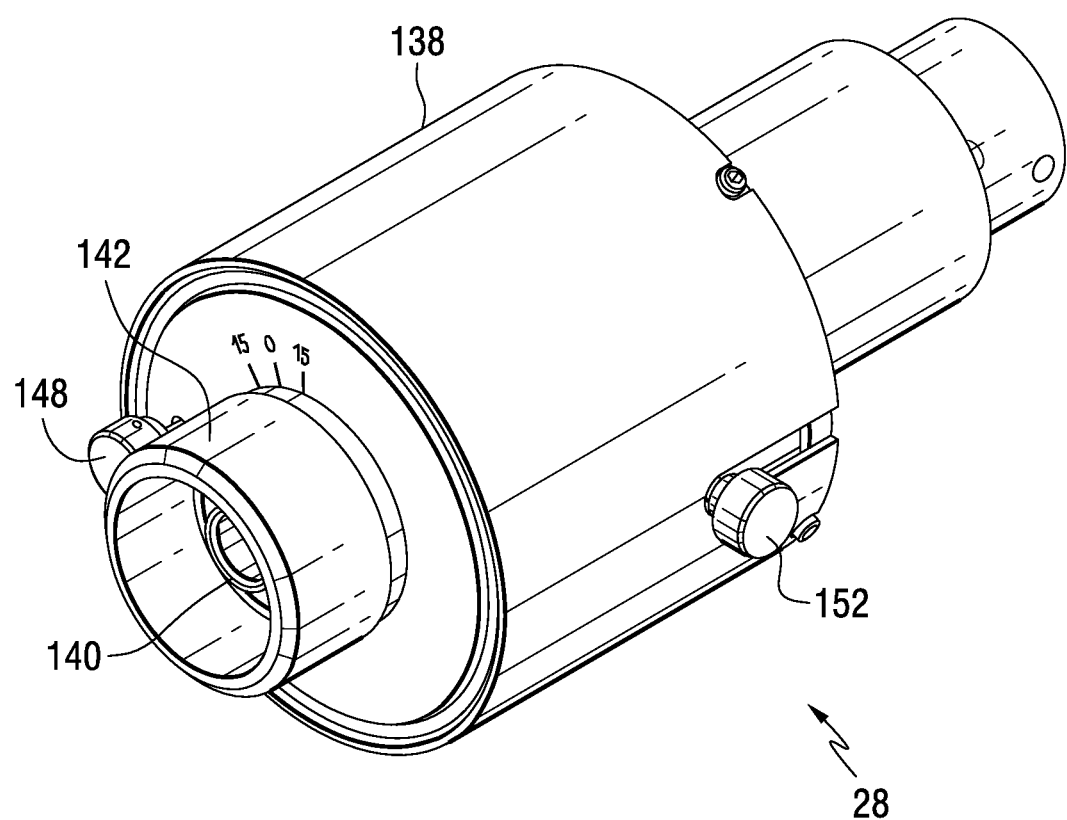
FIG. 2B is an isometric view of a goniometer which receives the specimen holder of FIG. 2A.

Referring now to FIG. 2B, goniometer 28 is illustrated having a goniometer body 138 which is received by the apparatus 10 and in turn receives sample holder 30 through entry port 140. The goniometer is also utilized to orient the sample 12 within the apparatus 10 with respect to one or both of electron beam 18 and ion beam 34. Entry port 140 is sized and dimensioned to receive and retain sample holder 30 and in light of the need to maintain a vacuum and/or isolate the sample 12 during the milling and imaging operations, must maintain an interference fit, in association with elastomeric seals, with sample holder 30. Therefore, goniometer 28 is provided with interchangeable sleeves incorporating entry port 140 which are sized and dimensioned to receive various sample holders compatible with various manufacturers microscopes, including sample holder 30. Alternative holders will include all types of the prior art, including those which may encapsulate sample 12 after milling and permit transfer under controlled environmental conditions to the microscope.

Figure 2C:
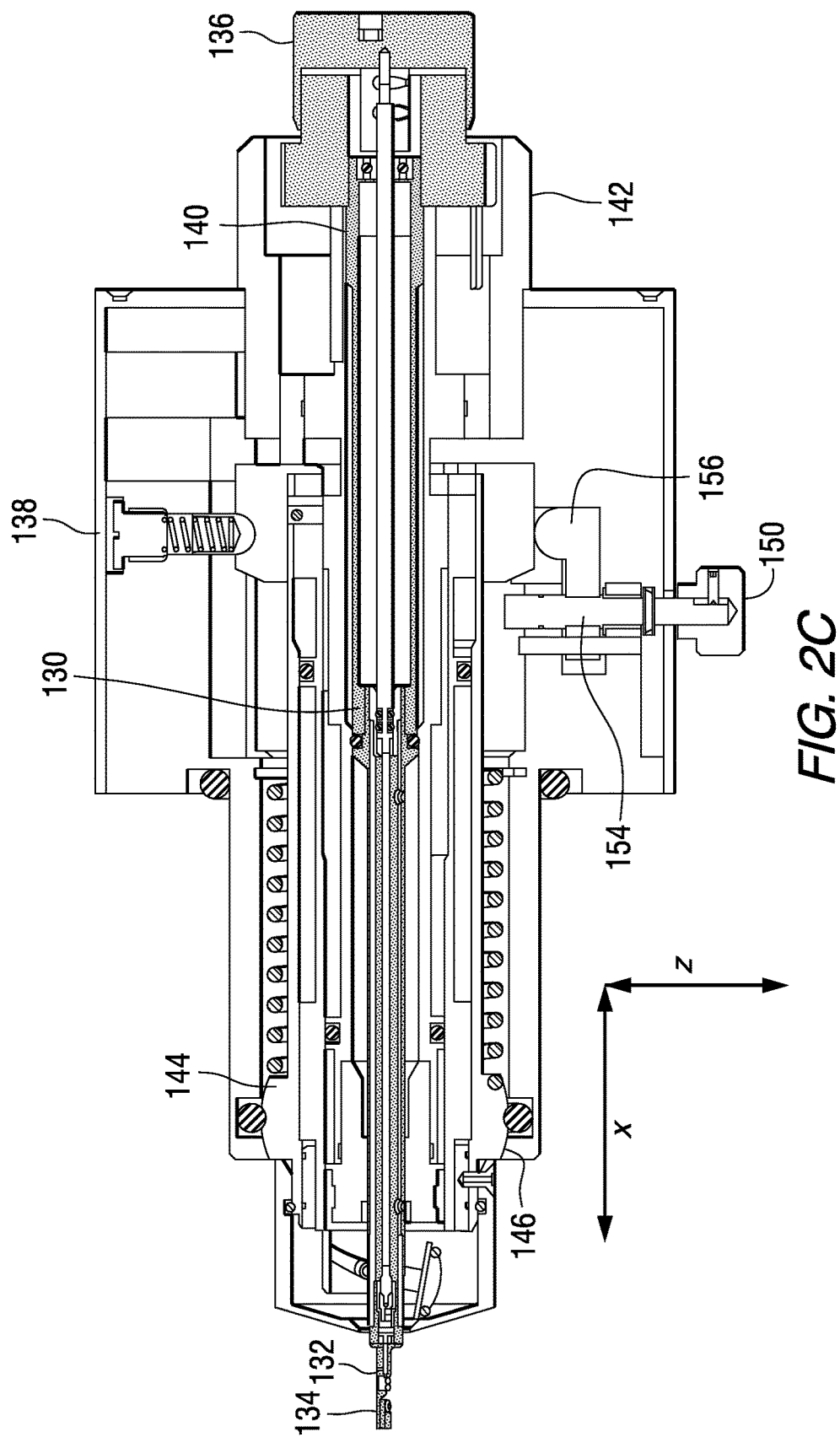
FIG. 2C is a sectional view of the holder of FIG. 2A inserted in the goniometer of FIG. 2B

Referring now to FIGS. 2A, 2B and 2C, goniometer 28 is further provided with an inner body 144 which is pivotable in three dimensions about bearing surface 146, as will be described more fully below. Goniometer 28 permits the rotation of sample holder 30 about its longitudinal axis as shown by curved arrow t in FIG. 2A. This is accomplished by tilt knob 142. Tilt knob 142 rotates the entry port 140 which has received sample holder 30. For the purposes of milling sample 12, the tilting function is typically up to ±60 degrees, with a preferred range of ±15-35 degrees and a most preferred range of ±15 degrees. Each of these measurements is with respect to the incident ion beam 34. With respect to certain imaging requirements, it may be necessary to tilt the sample 12 to an extreme position so that the leading edge of sample 12 may be imaged. This will require the incident electron beam 18 to be focused on the edge, rather than the top surface of sample 12. In this manner, the goniometer 28 may tilt the sample 12 approximately 90 degrees toward the electron column 24, with a maximum of 100 degrees.

Goniometer 28 is also adapted to displace the sample 12 linearly in three dimensions. Referring now to FIG. 2B, X-dimension adjustment knob 148 is provided to displace the sample 12 in the dimension designated by the x vector in FIG. 2A. Rotation of X-dimension adjustment knob 148 displaces entry port 140 with respect to inner body 144. Referring now to FIG. 2C, Z-dimension adjustment knob 150 is provided to displace the sample 12 in the dimension designated by the z vector. Referring now to FIG. 2B, Y-dimension adjustment knob 152 is provided to displace the sample 12 in the dimension designated by the y vector in FIG. 2A. Rotation of the Z-dimension, X-dimension and Y-dimension adjustment knobs 150, 148, 152 causes shaft 154 to rotate which is threadably engaged with lobe 156. Lobe 156 engages inner body 144 and pivots inner body 144 about bearing surface 146, which displaces sample 12 accordingly.

The sample 12 is manipulated in the three dimensions so that the ion beam 34 can be directed at different angles and/or different areas of the sample 12 with variable beam energies (in light of the distance from the ion source 14) to remove material 16 at different rates or from different portions of the sample 12. Varying the incident milling angle between the ion beam 34 and the sample 12 can promote differing topographical effects in the sample, e.g., smoothing. Adjustment with respect to the electron column 24 improves image quality and allows focus on surface features. Typical working distances between the electron column 24 and sample 12 are 16±0.5 mm.

It is to be specifically understood that the goniometer 28 need not be present in other embodiments in which the various pieces of equipment such as the ion source 14, electron column 24, and detector 20 are themselves reoriented and moved while the sample 12 remains stationary in the apparatus 10. The view of FIG. 2 may be such that the goniometer 28 is located at a different angle to the various pieces of equipment shown with reference to FIG. 1, and the sample holder 30 of the goniometer 28 holds the sample 12 up to the various pieces of equipment previously discussed with respect to FIG. 1.

The chamber 60 into which the various pieces of equipment are located can be a vacuum chamber 60, and the placement of the various components within the same chamber 60 may allow for multiple processes to be conducted without the need to break vacuum or otherwise move the sample 12 to a different piece of equipment In certain arrangements, at least a portion of the ion source 14, backscatter electron detector 38, electron column 24, detector 20, Faraday cup 32, secondary electron detector 36, sample holder 30, sample 12, and goniometer 28 may be located within the vacuum chamber 60. However, it is to be understood that other arrangements exist in which one or more of these aforementioned pieces of equipment have no portion thereof that is located within the vacuum chamber 60.

Figure 3:
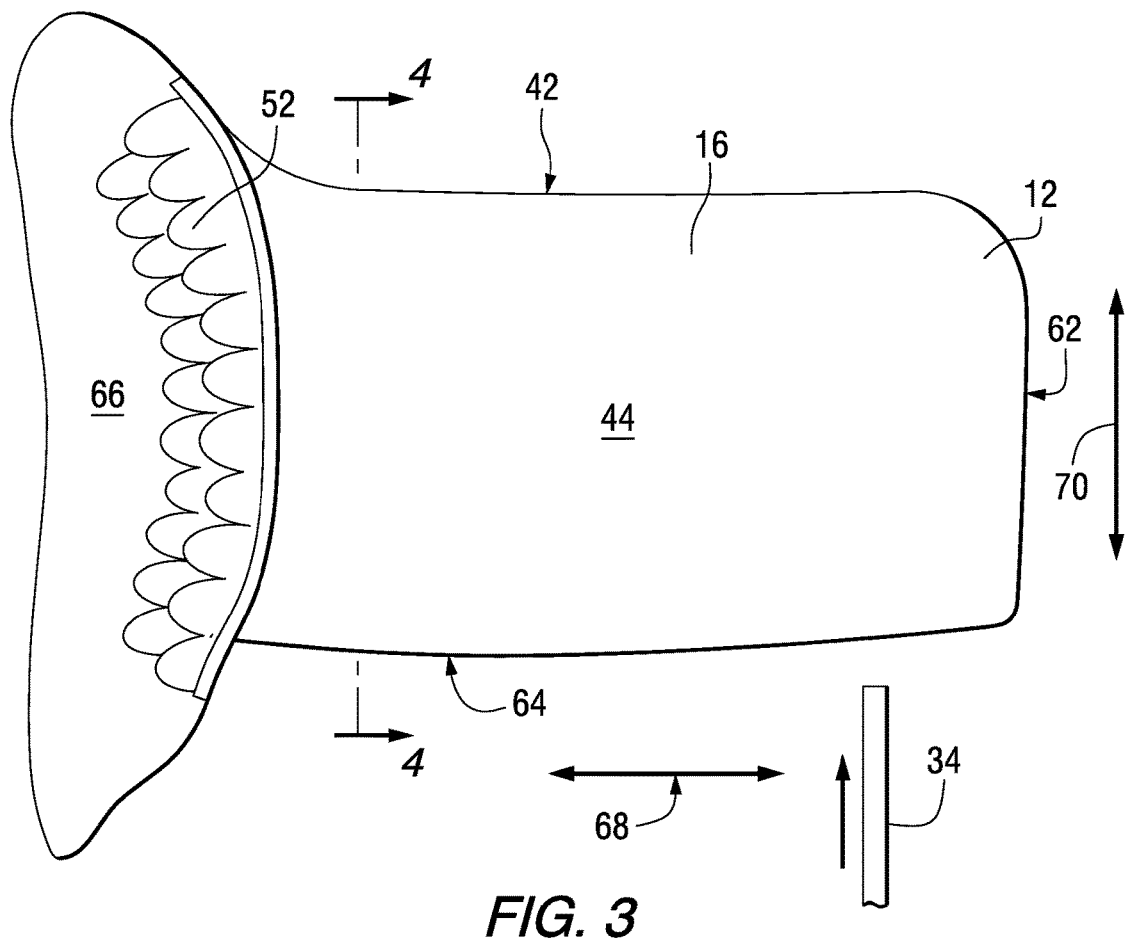
FIG. 3 is top plan view of a sample in the form of a lamella mounted onto a grid.

FIG. 3 is a plan view of the sample 12 as mounted on grid 66. The sample 12 may be measured in terms of micrometers, and the sample 12 as shown in FIG. 3 is thus a very small object. The sample 12 is sometimes referred to as a lamella, and may be less than 100 nanometers in thickness. However, the sample 12 can be of any size in accordance with various exemplary embodiments and is not limited to a particular size or range of sizes. The sample 12 can be mounted onto the grid 66 by means of a metal deposition process in some embodiments. The metal deposition attachment is identified by reference number 52, but it is to be understood that any type of attachment between the sample 12 and the grid 66 can be employed in other arrangements. The sample 12 may be stationary with respect to the sample holder 30 and grid 66 at least in the location of attachment thereto. An outer edge 62 of the sample 12 is identified as the portion of the sample 12 that is farthest from the metal deposition 52.

The sample 12 may be thinned or milled so that it can be subsequently imaged and analyzed microscopically. The thinning may be performed so that various features of the sample 12, such as critical dimensions and internal structure, can be ascertained by the microscopy process. Due to the very small size of the sample 12, the features may only be realized by extremely sensitive equipment thus necessitating the need to thin the sample 12 which may be required by processes capable of sensing these smaller features. The ion beam 34 can be directed onto a leading edge 64 of the sample 12 in order to remove material 16 from the sample 12 and create a thinned location. A tailing edge 42 of the sample 12 is located opposite from the leading edge 64. The edges 64, 42, 62 are identified for sake of convenience and it is to be understood that their relationship with respect to the grid 66 or other portions of the apparatus 10 can be changed in other embodiments.

The ion source 14 may mill material 16 from the sample 12 so that a thinned location is created. The ion beam 34 is shown in FIG. 3 as being directed towards the leading edge 64. The ion beam 34 may strike the leading edge 64 at an angle and remove material 16 from the upper surface 44. The ions 34 can be moved in a scanning or rastering motion, in a longitudinal direction 68, or alternatively or in addition the sample 12 can be moved in the longitudinal direction 68 relative to the ion beam 34 consistent with the x vector of FIG. 2A, so that the milling can occur along the longitudinal length of the sample 12. The milling may be along the entire longitudinal length of the sample 12, or may be along only a portion of the longitudinal length of the sample 12.

Figure 4:
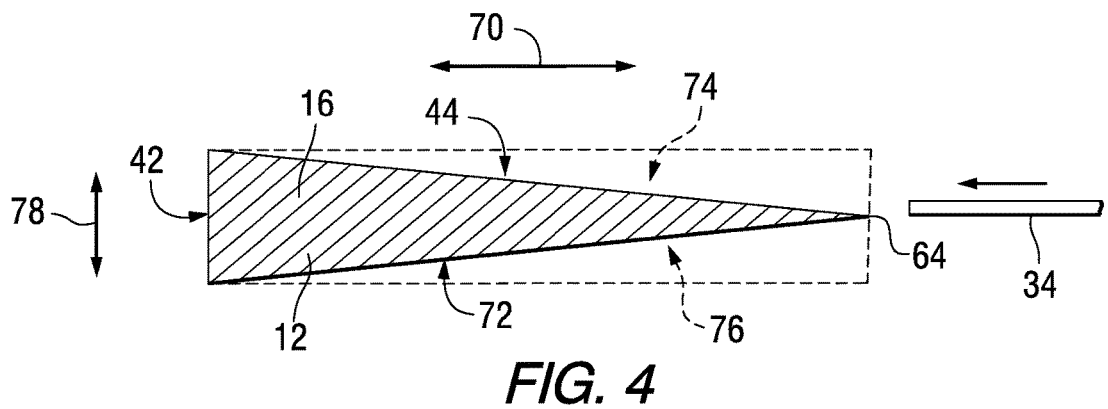
FIG. 4 is a cross-sectional side view of the sample of FIG. 3 taken along line 4-4.

The thinning of the sample is shown in a side view with reference to FIG. 4. The ion beam 34 impinges onto the upper surface 44 of the sample 12 at the leading edge 64. This action results in the creation of an upper removed portion 74 that extends from the leading edge 64 to the tailing edge 42. The bottom surface 72 of the sample 12 may likewise be milled such that the ion beam 34 strikes the bottom surface 72 at an angle extending from the leading edge 64 to the tailing edge 42. The ions 34 cause a lower removed portion 76 to be formed in which material 16 of the sample 12 is removed therefrom. The size of the sample 12 in the height direction 78 is typically very small in relation to the size of the sample 12 in the longitudinal direction 68 and the lateral direction 70. The sample 12 can also be milled in other manners. For instance, only the upper surface 44 or lower surface 72 can be milled. Also, other shapes or angles of material 16 can be removed in other exemplary embodiments. The apparatus 10 may be designed so that once the thinned location is created, the electron beam 18 impinges the sample 12 at the thinned location. If the thinned location is thin enough, then one or more electrons may travel through the sample 12, or as rastered across the surface of sample 12, pass immediately adjacent the leading edge 64 to be detected by the detector 20. The thinned portion can be at any location in the sample 12 and need not be located at a particular edge or boundary as shown in the figures, which display only certain exemplary embodiments. Further, although described as a straight line, the thinned location can be variously shaped in accordance with other exemplary embodiments. The sample 12 is thinned such that its thickness is made smaller. This thinning need not be across the entire sample 12, but need only be at a portion of the sample 12.

Figure 5:
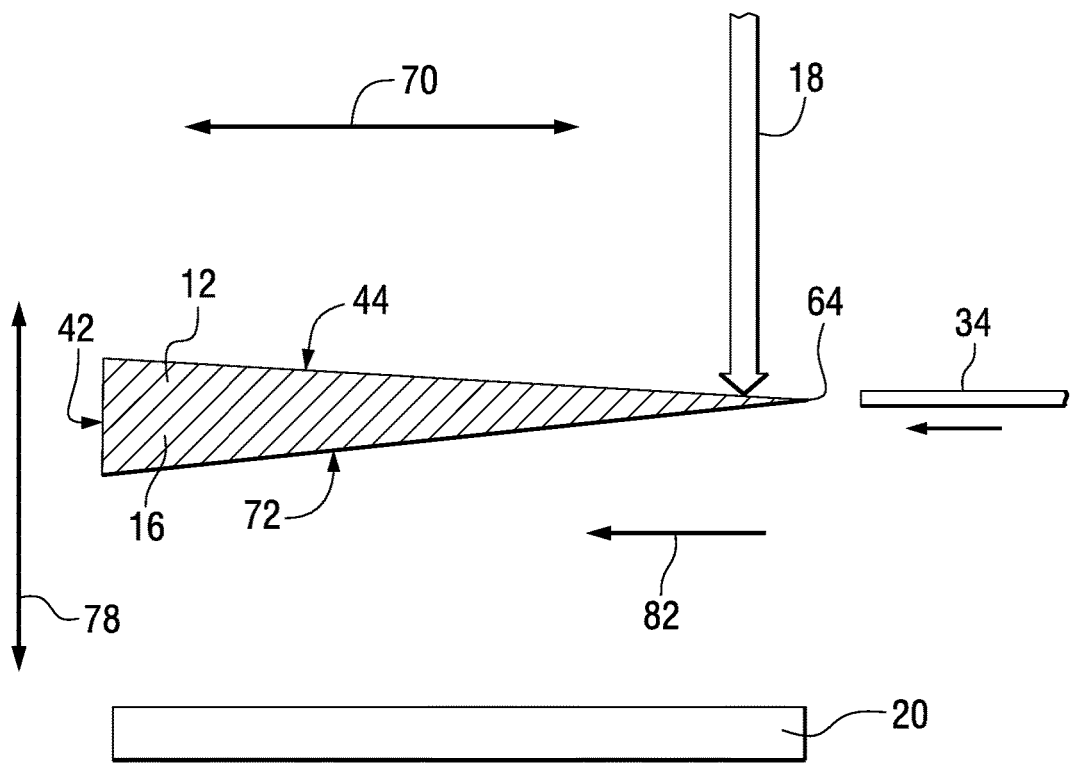
FIG. 5 is a cross-sectional side view of a sample with an electron beam impinging thereon.

With reference now to FIG. 5, the sample 12 is shown being milled by the ion beam 34 and positioned above the detector 20 in the apparatus 10. The electron beam 18 is aligned with detector 20 such that absent the sample 12, the electrons of electron beam 18 will strike detector 20. In the presence of sample 12, electron beam is at least partially directed onto the upper surface 44 of the sample 12 aril may not impinge detector 20. Initially, sample 12 may nominally be too thick for electron beam 18 to pass through, even partially. As the material of sample 12 is thinned, a portion of the electrons of electron beam 18 may pass through the thinned section of sample 12 and strike detector 20.

The electron beam 18 may be moved or rastered across the sample 12 such that it strikes different parts of the upper surface 44. In this regard, the electron beam 18 may move in the lateral direction 70 and longitudinal direction 68 through movement of the sample 12 relative to the electron beam 18. Milling of the sample 12 by the ion beam 34 may occur simultaneously with the impingement of the electron beam 18, or the milling may occur at different times than when the sample 12 is being impinged. This milling causes the leading edge 64 to recede in the direction noted by the receding line 82, which is a direction in the lateral direction 70.

Figure 6:
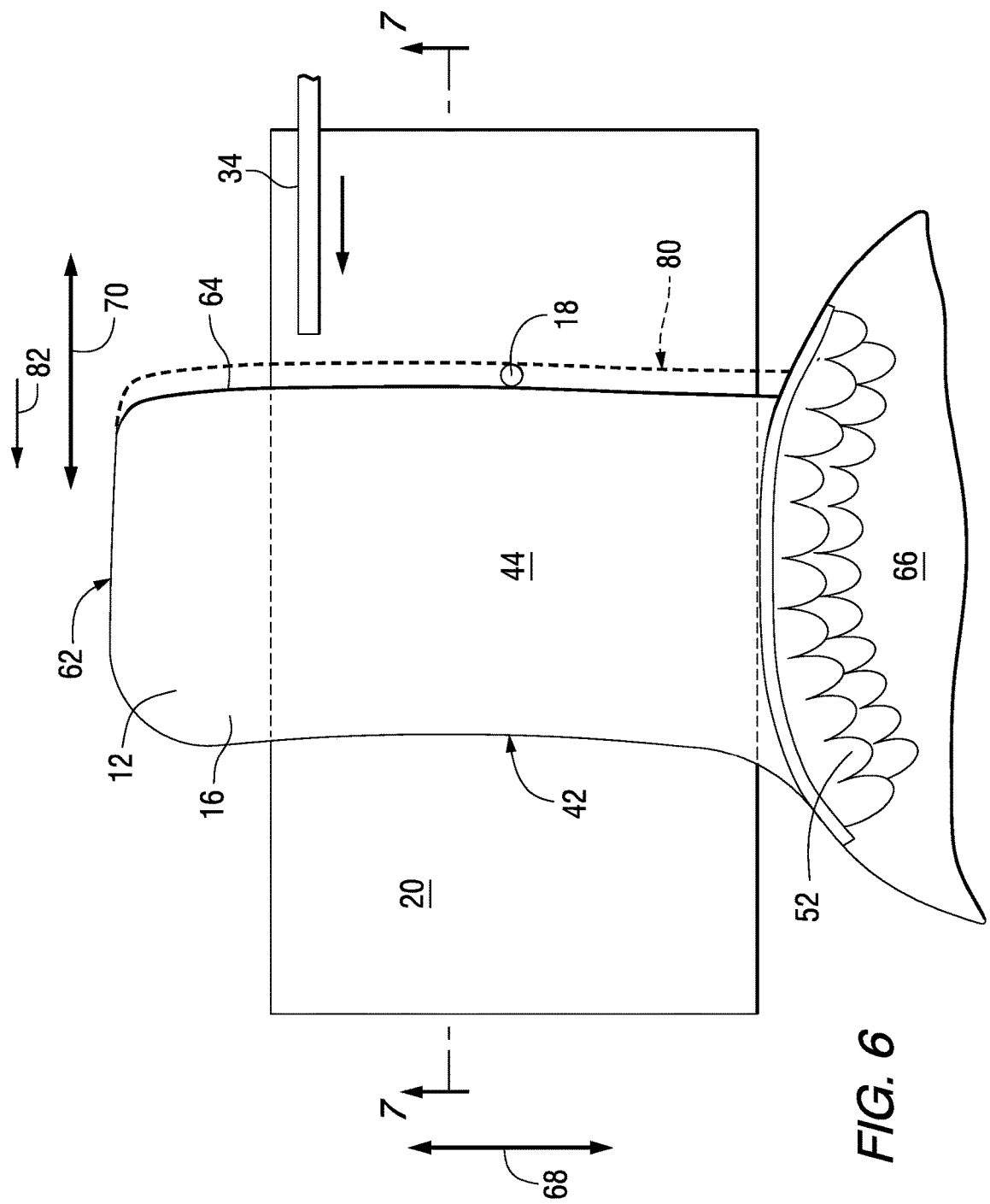
FIG. 6 is a top plan view of the sample of FIG. 5 in which the leading edge has receded to the point that the electron beam can be detected by the detector.

Continued milling of the sample 12 will cause the leading edge 64 to recede to such a point that at least a portion of the electron beam 18 will directly strike the detector 20. FIG. 6 shows a top plan view of the sample of FIG. 5 in which the leading edge 64 has receded to such a point that electron beam 18 is located adjacent the leading edge 64 and impinges directly onto the detector 20 (not shown). A previous leading edge 80, prior to commencement of milling operations is shown for reference which may be consistent with the leading edge 64 as shown in FIG. 3.

Figure 7:
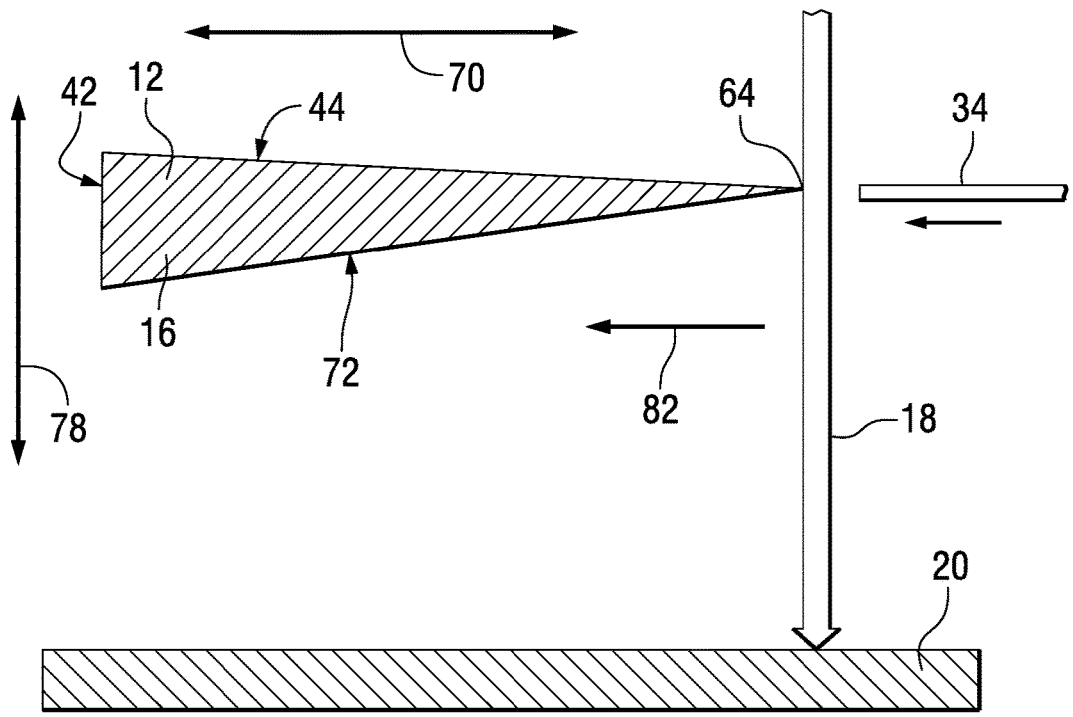
FIG. 7 is a cross-sectional side view of the sample of FIG. 6 taken along line 7-7.
Figure 8:
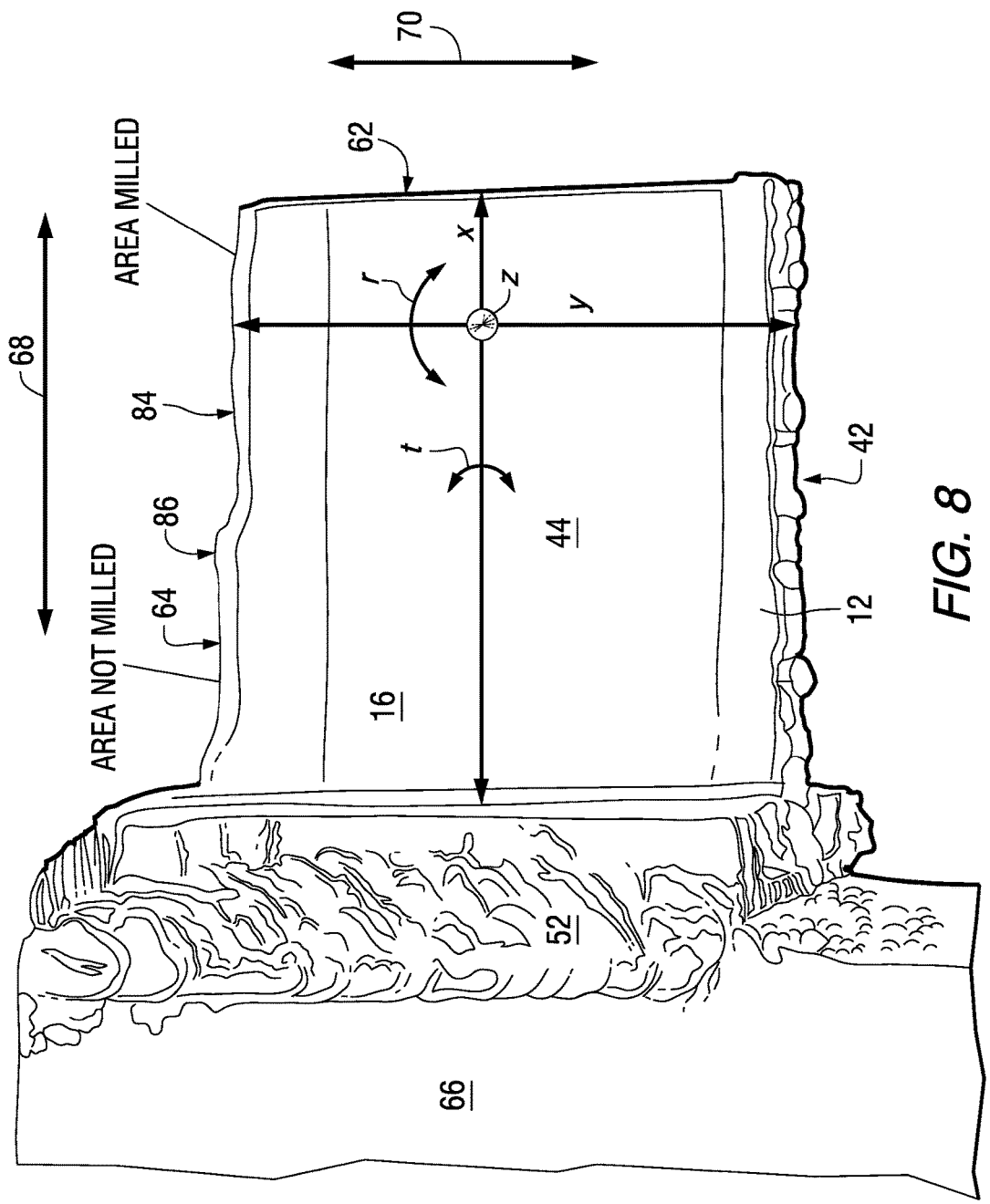
FIG. 8 is a top plan view of a sample in accordance with another exemplary embodiment.

Referring now to FIGS. 7 and 8, FIG. 7 is a side elevation view of a portion of the view of FIG. 6 in which the electron beam 18 is shown as located adjacent the leading edge 64 and striking the detector 20. FIG. 8 is a top plan view of a sample 12 subsequent to milling. The electron beam 18 moves by rastering in the lateral direction 70 of the y vector as shown in FIG. 8 from a position intermediate the sample 12 to a position beyond the leading edge 64. The electron beam 18 is also continuously displaced in the lateral direction 68 of the x vector between scans. The effect of this rastering is that the detector 20 receives no electrons while the electron beam 18 is blocked by the sample 12 and receives electrons when the rastered electron beam 18 passes beyond the leading edge 64.

Figure 8A:
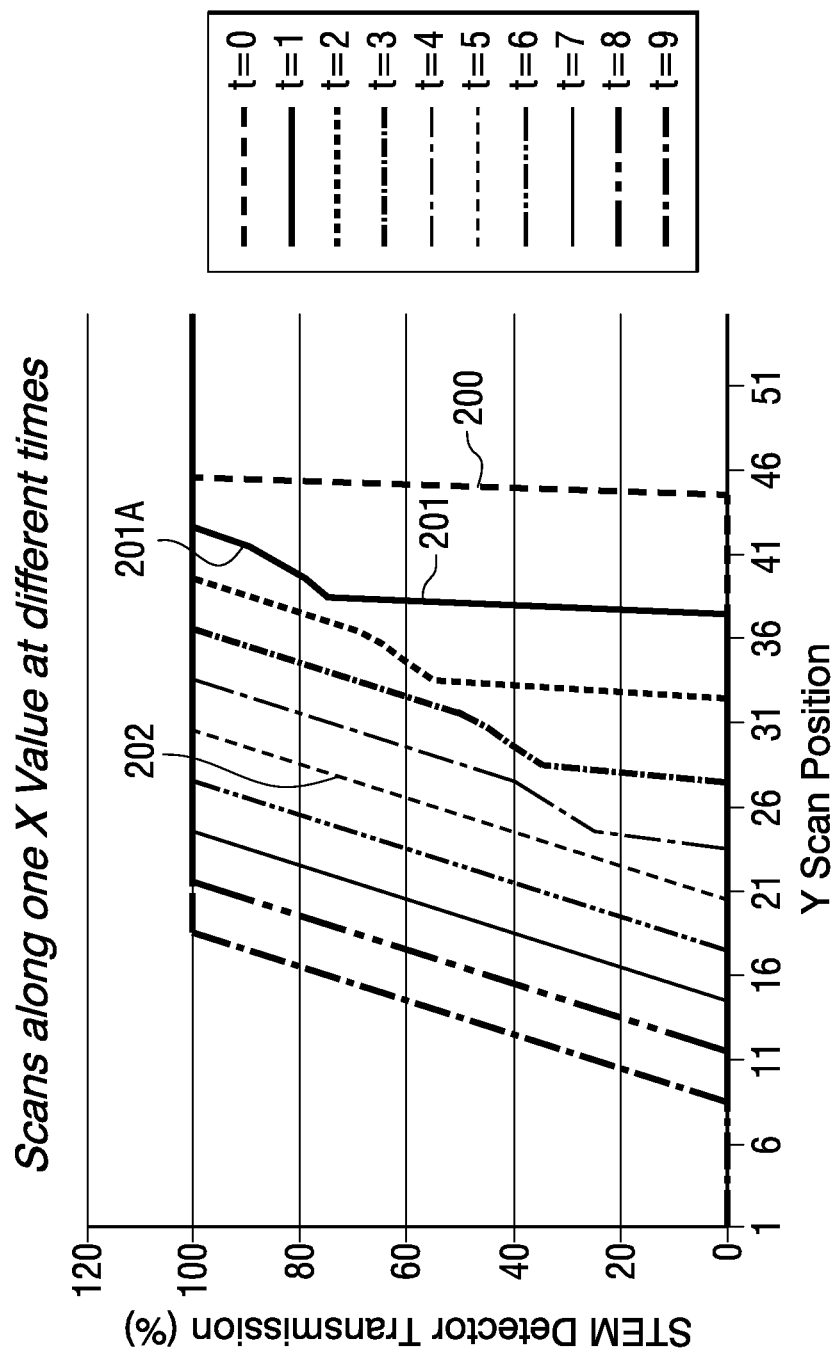
FIG. 8A is a graphical presentation of the detection of the electron beam of FIG. 5 with respect to a sample.

Referring now to FIG. 8A, at time t=0, line 200 indicates that electron beam 18 is completely blocked by sample 12 at the initiation of the rastering motion intermediate the sample 12 at position 1 on the X-axis of FIG. 8A. This is indicated by a 0% transmission as detected by detector 20 on the Y-axis of FIG. 8A. As the electron beam 18 is rastered toward the leading edge 64, a 0% transmission is detected until the electron beam 18 reaches the leading edge 64, which is located at approximately 45 on the X-axis. The detector 20 detects a very sudden rise in electrons, indicating a very abrupt leading edge 64 of sample 12, with 100% beam transmission reached within a relatively short distance, all as indicated by line 200. In contrast, line 201 indicates a different reception profile at detector 20 at time t=1. The milled edge of leading edge 64 is apparent from the reduction in slope from line 201 to line 201A. This indicates an increasing amount of electron transparency in the portion of sample 12 adjacent leading edge 64 as a gradual slope is formed in the surface of sample 12. The change in slope indicates, however, that the sample 12 is not yet milled evenly from top to bottom, forming a wedge as shown in FIG. 4. At line 202, it is apparent from the continuous and even slope of the line that the sample is now milled into a wedge as shown in FIG. 4, with the position of 100% transmission moving back evenly with the point of 0% transmission. This indicates that the milling operation may be terminated at this point.

Alternatively, the sample 12 is moved or rotated during the milling operation and the electron beam 18 is held in a consistent position. An additional embodiment may hold both sample 12 and electron beam 18 in consistent positions and the detection operation is solely based upon the milling of material past the electron beam 18 location.

The detector 20 may detect a single electron that passes through sample 12 or adjacent the leading edge 64, or may detect any preselected quantum of electrons of the electron beam 18 that pass through or adjacent to the leading edge 64. The detector 20 may detect the electron beam 18 without a shadow being imparted onto the detector 20 caused by the presence of the sample 12 between the electron column 24 and the detector 20. Once the detector 20 makes any of the previously stated detections, or endpoints of the milling operation, the milling of the sample 12 may be terminated by operation of a logic control, as discussed more fully below, and the sample 12 is ready for microscopic imaging and analysis. Alternatively, once the detector 20 makes the determination that the preselected quantum of electron beam 18 has been achieved, the sample 12 may be continued to be milled to further remove material 16. In this regard, the upper and/or lower surfaces 44, 72 can be sputtered by the ion beam 34 across their entire areas. Alternatively, other areas of the sample 12 can be removed once the detector 20 makes the aforementioned detections. The apparatus may be configured such that the sample 12 is thinned at other locations of the sample 12 by the ion source 14 either before or after the detector 20 detects the preselected endpoint.

The leading edge 64 is an edge of the sample 12 that recedes due to being milled by the ion beam 34. The leading edge 64 may be any edge of the sample 12 such as one that is on the left side, right side, outer side, or inner side. There can be multiple leading edges of a sample 12 if different edges of the sample 12 are milled so as to recede. As such, in some embodiments different leading edges of the sample 12 are scanned and the detector 20 may watch for the electron beam 18 to move past one of these receding leading edges 64. The leading edge 64 may be a point surface or may have some amount of height, such as in the height direction 78.

The detector 20 may include a bright field portion and a dark field portion. The bright field portion may detect bright field electrons, and the dark field portion may detect dark field electrons. The dark field portion may further be divided up into an annular dark field and a high angle annular dark field. The brightness of the image at each point can be determined by ascertaining the quantum of electrons that have passed through the sample 12. The detector 20 may detect that the leading edge 64 has receded when the bright field portion includes all of the electrons from electron beam 18 and the dark field portion receives none of said electrons, thus signifying that 100 percent of the electrons are passing adjacent the leading edge 64. Alternatively, depending upon the arrangement of the apparatus 10, it may be the case that the electrons strike the dark field portion instead of the bright field portion upon the leading edge 64 receding. In these arrangements, all of the electrons are detected at one spot of the detector 20 and not at other portions of the detector 20, signifying that the leading edge 64 has receded to the preselected endpoint and the sample 12 is appropriately dimensioned.

Referring now to FIG. 8, the sample 12 is attached to the grid 66 by way of the metal deposition 52 and is shown as being generally rectangular in elevational appearance. The tailing edge 42 is not acted on by the ion beam 34 and no material 16 from the tailing edge 42 is removed. The ion beam 34 functions to remove material 16 from the upper surface 44 at the leading edge 64. This causes a portion of the upper surface 14 to be thinned at the thinned leading edge 84 to cause the leading edge 64 to recede. However, the removal of the material 16 is not across the entire upper surface 44 but only from the outer edge 62 to some location in towards the metal deposition 52. An unthinned leading edge 86 results due to the fact that the thinning extends only part way across the leading edge 64 in the longitudinal direction 68. The sample 12 may be thicker in the height direction 78 across the entire leading edge 64 due to this milling scheme.

Although the electron beam 18 is not shown in FIG. 8, it may be imparted onto the upper surface 44 at various locations such as the thinning leading edge 84, and the unthinned leading edge 86. The material 16 may continue to be removed at the thinned leading edge 84 until the detected electrons reach a preselected threshold relative to thinned leading edge 84, but not unthinned leading edge 86. Once detection of the threshold occurs, the endpoint is reached and thinning may cease. If desired, additional thinning of the sample 12 can be conducted, for example at the unthinned leading edge 86 or at other locations on the upper surface 44 or lower surface 72.

To accomplish material 16 removal, the goniometer 28 can tilt the sample 12 through a range of degrees such as from 0 degrees to 15 degrees, from 15 degrees to 45 degrees, or up to 100 degrees. The orientation of the sample 12 with respect to the ion source 14 may be such that the ions 34 strike only the upper surface 44, only the lower surface 72, or both the upper and lower surfaces 44, 72.

Figure 9:
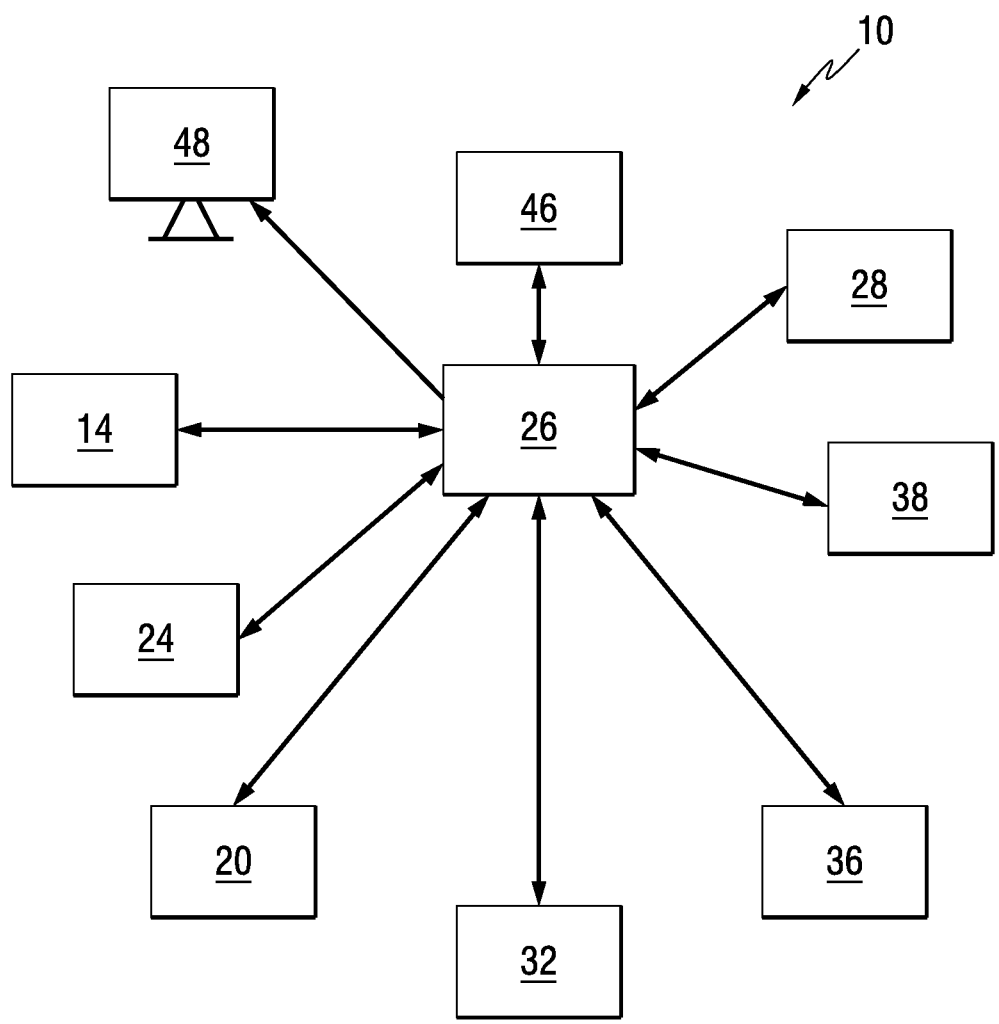
FIG. 9 is a schematic view of an apparatus for preparing samples.

A schematic diagram of the apparatus 10 is shown with reference to FIG. 9. The apparatus 10 includes a processor 26 in communication with a memory 46. The processor 26 and memory 46 may be part of a computer, and may be a single processor 26 and memory 46 or may be composed of multiple processors and multiple memories that are located at the various portions of equipment that will momentarily be referenced, or at other locations that make up the apparatus 10. The processor 26 may be in communication with the detector 20, Faraday cup 32, secondary electron detector 36, backscatter electron detector 38, and goniometer 28. This communication may be back and forth communication such that the processor 26 receives input from the pieces of equipment 20, 32, 36, 38, 28 and sends output to the pieces of equipment 20, 32, 36, 38, 28. However, other arrangements are possible in which the communication of data between the processor 26 and these components is either one way to or one way from the processor 26.

The ion source 14 and electron column 24 may also be in communication with the processor 26 and this communication may be two way communication or one way communication. A display 48 is in communication with the processor 26 and the processor 26 can send output signals to the display 48 in order to display information to a user of the apparatus 10 on the display 48.

The apparatus 10 may be arranged so that the sample 12 is thinned by the ion source 14, and so that the detector 20 receives a preselected quantum of electrons that pass through or adjacent to the leading edge 64. However, in this arrangement the thinning may take place regardless of whether the detector 20 detects electrons. The processor 26 may receive input data from the backscatter electron detector 38 and the secondary electron detector 36 and process this data in order to generate an image of the sample 12 on the display 48. The Image that is generated may be displayed when the electron beam 18 strikes the sample 12 in order to better orient and analyze the preparation process. The processor 26 may direct the milling of the ion source 14 through obtaining input from the Faraday cup 32 and the goniometer 28, and can reorient the goniometer 28 as necessary. The processor 28 may send commands to the ion source 14 to cause the ion source 14 to stop generating the ion beam 34 once the processor 26 receives a signal from the detector 20 that signifies that one or more electrons from the electron beam 18 have been detected.

Although it has been described that milling may cease once the detector 20 detects the preselected quantum threshold of electron beam 18, it is to be understood that there is some degree of tolerance in this process. The stoppage of removal of material 16 from the sample 12 is thus triggered by the detection of one or more electrons from the electron beam 18 and this triggering may be immediate or some amount of time may elapse after this detection.

The apparatus 10 may be arranged so that the ion beam 34 removes material 16 while the electron beam 18 is directed onto the sample 12 at the same time. In other arrangements, the ion beam 34 may remove material 16 without the impingement of the electron beam 18 onto the sample 12. The ion beam 34 may cease removal of material 16, and then subsequently the electron beam 18 can be impinged onto the sample 12 and the detector 20 can determine whether a preselected quantum of electrons are moving through or adjacent the leading edge 64. If none can be seen, the electron beam 18 can be stopped and the ion source 14 may again function to mill the material 16 in this sequence until the electron beam 18 is detected by the detector 20. During this type of preparation, the processor 26 may instruct the goniometer 28 to reorient the sample 12 between the appropriate milling position, and the appropriate electron beam 18 detection position. Although this method of preparing the sample 12 for microscopy is slower, it may still increase the speed at which samples 12 are prepared because one does not have to break vacuum or otherwise move the sample 12 between different devices for the thinning process and the measurement of thickness process.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed:

1. An apparatus for thinning a sample for electron microscopy, said sample having a leading edge, a trailing edge and at least one axis extending therebetween, said apparatus comprising:
   (i) an ion beam generator which emits an ion beam:
      (a) directed at a target area on the surface of said sample; and
      (b) causing material to be removed from said target area of said sample;
   (ii) an electron beam generator which emits at least one electron beam sequentially directed across said target area along said at least one axis of said sample; and
   (iii) an electron beam detector:
      (a) in electronic communication with said ion beam generator;
      (b) mounted opposite said electron beam generator with respect to said sample;
      (c) receiving electrons from said electron beam when said electrons meet at least one of the conditions of: passing through, deflected by and passing adjacent sample material within said target area; and
      (d) generating a first electronic signal comprising a series of measurements, each of which is:
         (i) associated with a plurality of locations along said at least one axis of said sample within and adjacent said target area;
         (ii) indicative of
         the quantum of electrons received by said electron beam detector meeting at least one of the conditions of: passing through, deflected by and passing adjacent said target area, taken along said at least one axis of said sample; and
         (iii) represented in the form of a line indicative of the degree to which said ion beam has removed material from said target area of said sample, said line having at least one of generally uniform and non-uniform slopes; and
      (e) comparing each one of said series of measurements to a preselected slope condition of said first electronic signal and transmitting a second electronic signal to said ion beam generator terminating generation of said ion beam when said first electronic signal meets said preselected slope condition.

2. The apparatus as set forth in claim 1, wherein the ion beam is generated from a gas selected from the group consisting of: argon, xenon and neon.

3. The apparatus as set forth in claim 1, wherein said sample further comprises a leading edge and top and bottom surfaces adjacent thereto and said ion beam is directed to at least one of said leading edge, said top surface and said bottom surface and said electron beam is directed to at least one of said top and bottom surfaces.

4. The apparatus as set forth in claim 3, further comprising a mounting surface for said sample, said mounting surface being adjustable in three dimensions with respect to at least one of said ion beam and said electron beam.

5. The apparatus as set forth in claim 1, wherein said electron beam is generated by a scanning electron microscope.

6. The apparatus as set forth in claim 1, wherein said electron beam detector further comprises a scanning transmission electron microscope (STEM) detector.

7. The apparatus as set forth in claim 1, further comprising a processor in electronic communication with an electronic memory, said ion beam generator and said electron beam detector.

8. The apparatus as set forth in claim 7, wherein said preselected slope condition is stored in said electronic memory and said processor terminates generation of said ion beam when said electronic signal meets said stored preselected slope condition.

9. The apparatus as set forth in claim 8, wherein said preselected slope condition is correlated to a physical dimension threshold.

10. The apparatus as set forth in claim 8, wherein said preselected slope condition is a uniform slope condition.

11. The apparatus as set forth in claim 1, further comprising a separable specimen holder which receives said sample and which is insertable in a dedicated port in said apparatus.

12. The apparatus as set forth in claim 1, further comprising an entry port for receiving said sample, said entry port being adjustable to permit the selective location of said sample with respect to at least one of said ion beam and said electron beam.

13. The apparatus as set forth in claim 1, further comprising at least one additional detector which receives electrons which have been reflected from a surface of said sample and which form an image.

14. The apparatus as set forth in claim 1, wherein at least one of said electron beam and said ion beam are scanned across at least one surface of said sample.

15. The apparatus as set forth in claim 14, wherein said electron beam is scanned across said target area of said sample.

16. The apparatus as set forth in claim 1, wherein said electron beam is sequentially scanned across said target area of said sample.

17. The apparatus as set forth in claim 16, wherein said electron beam is sequentially scanned across said target area of said sample at preselected time intervals.

18. The apparatus as set forth in claim 1, wherein said first electronic signal is indicative of a physical dimension of said sample.

19. The apparatus as set forth in claim 18, wherein said preselected slope condition is correlated to a physical dimension threshold.

20. A method of thinning a sample for electron microscopy, comprising the steps of:
 (i) directing a generated ion beam at a target area on a surface of said sample;
 (ii) removing material from said sample at said target area of said sample with said ion beam;
 (iii) directing an electron beam from an electron source at said target area of said sample;
 (iv) positioning an electron beam detector opposite said electron source with respect to said sample;
 (v) detecting electrons from at least one of: said electron beam passing through, being deflected by and passing adjacent material within said target area of said sample with said electron beam detector;
 (vi) preselecting a slope condition of an electronic signal indicative of:
  (A) the quantum of electrons received by said detector; and
  (B) the degree to which said ion beam has removed material from said sample;
 (vii) deriving said electronic signal from said electron beam detector represented in the form of a line indicative of the degree to which said ion beam has removed material from said sample, said line having at least one of generally uniform and non-uniform slopes;
 (viii) comparing said derived electronic signal from said electron beam detector with said preselected slope condition of said electronic signal; and
 (ix) upon reaching said preselected slope condition of said electronic signal, terminating the generation of said ion beam.

21. The method as set forth in claim 20, wherein said ion beam is directed at a leading edge of said sample and said electron beam is directed at said leading edge of said sample from a direction normal to said ion beam.

22. The method as set forth in claim 20, wherein at least one of said electron beam and said ion beam are scanned across at least one surface of said sample.

23. The method as set forth in claim 22, wherein said electron beam is scanned across at least one of a top and bottom surface of said sample in a direction normal to the direction of the scanning of said ion beam along at least one of the leading edge, top surface and bottom surface of said sample.

24. The method as set forth in claim 23, wherein said electron beam is sequentially scanned normal to the direction of the scanning of said ion beam along a leading edge of said sample.

25. The method as set forth in claim 23, wherein said electronic signal varies with respect to the passage of electrons through said sample and the slope of such variation of said electronic signal is indicative of the degree to which said ion beam has removed material from said sample.

26. The method as set forth in claim 25, wherein said preselected slope condition is a slope value of a line indicative of said variation of said electronic signal.

27. The method as set forth in claim 25, wherein said termination of the operation of said ion beam occurs when a slope value of said preselected slope condition of said electronic signal is uniform.

28. The method as set forth in claim 22, wherein said electron beam is sequentially scanned across said target area of said sample.

29. The method as set forth in claim 28, wherein said electron beam is sequentially scanned across said target area of said sample at preselected time intervals.

30. The method as set forth in claim 20, further comprising the step of detecting electrons which are reflected from the surface of said sample and deriving an image therefrom.

31. The method as set forth in claim 20, wherein said first electronic signal is indicative of a physical dimension of said sample.

32. The method as set forth in claim 31, wherein said preselected slope condition is correlated to a physical dimension threshold.

33. A method of thinning a sample for electron microscopy, comprising the steps of:
 (i) directing a generated ion beam at a target surface of said sample;
 (ii) removing material from said sample at said target surface of said sample with said ion beam;
 (iii) directing an electron beam from an electron source at said target surface of said sample wherein at least one of said electron beam and said ion beam are scanned across at least one target surface of said sample and said electron beam is scanned across at least one of a top and bottom surface of said sample in a direction normal to the direction of the scanning of said ion beam along a leading edge of said sample;

(iv) positioning an electron beam detector opposite said electron source with respect to said sample;

(v) detecting electrons from at least one of: said electron beam passing through and said electron beam passing adjacent said sample with said electron beam detector;

(vi) preselecting a quantitative threshold of an electronic signal indicative of:
  (A) the quantum of electrons received by said detector; and
  (B) the degree to which said ion beam has removed material from said sample;

(vii) deriving said electronic signal from said electron beam detector which varies with respect to the passage of electrons through said sample and the slope of such variation of said electronic signal is indicative of the degree to which said ion beam has removed material from said sample;

(viii) comparing said derived electronic signal from said electron beam detector with said preselected quantitative threshold of said electronic signal; and (ix) upon reaching said preselected quantitative threshold of said electronic signal, terminating the generation of said ion beam.

34. The method as set forth in claim 33, wherein said preselected quantitative threshold value is a slope value of a line indicative of said variation of said electronic signal.

35. The method as set forth in claim 33, wherein said termination of the operation of said ion beam occurs when a slope value of said variation of said electronic signal is constant.

* * * * *